United States Patent [19]

Vetanen et al.

[11] Patent Number: 4,656,076

[45] Date of Patent: Apr. 7, 1987

[54] SELF-ALIGNED RECESSED GATE PROCESS

[75] Inventors: William A. Vetanen, Hillsboro; Kimberly R. Gleason, Portland; Irene G. Beers, Tigard, all of Oreg.

[73] Assignee: Triquint Semiconductors, Inc., Beaverton, Oreg.

[21] Appl. No.: 727,484

[22] Filed: Apr. 26, 1985

[51] Int. Cl.[4] .................. B32B 3/10; G03C 5/00; H01L 21/00

[52] U.S. Cl. .................. 428/137; 428/330; 428/901; 148/1.5; 29/576 B; 29/576 C; 29/578; 430/312; 430/313; 430/314; 430/319; 430/323; 430/324; 430/329

[58] Field of Search ............. 430/312, 313, 314, 315, 430/316, 317, 319, 323, 324, 329; 29/576 B, 576 C, 578; 148/1.5, 187; 428/137, 330, 901

[56] References Cited

U.S. PATENT DOCUMENTS

| | | | |
|---|---|---|---|
| 4,011,105 | 3/1977 | Paivenen et al. | 148/1.5 |
| 4,074,301 | 2/1978 | Paivenen et al. | 357/23 |
| 4,149,904 | 4/1979 | Jones | 148/1.5 |
| 4,182,023 | 1/1980 | Cohen et al. | 29/571 |
| 4,329,186 | 5/1982 | Kotecha et al. | 148/1.5 |
| 4,348,804 | 9/1982 | Ogawa et al. | 29/580 |
| 4,363,830 | 12/1982 | Hsu et al. | 427/88 |
| 4,497,109 | 2/1985 | Huber et al. | 29/578 |

OTHER PUBLICATIONS

A New Technology for Tapered Windows in Insulating Films, Journ. Electrochem Soc., USA, vol. 126, No. 3, (Mar. 1979), pp. 503-506.

GaAs Power Field-Effect Transistors for K-Band Operation, Taylor et al, RCA Review, vol. 42, Dec. 1981, pp. 508-521.

Primary Examiner—John E. Kittle
Assistant Examiner—Patrick Ryan
Attorney, Agent, or Firm—William S. Lovell; Alexander C. Johnson, Jr.; John D. Winkelman

[57] ABSTRACT

An integrated circuit gate process and structure are disclosed which provide a self-aligned, recessed gate enhancement-mode GaAsFET. The process includes making self-aligned implants prior to gate metallization, with an intermediate step of applying patches of plasma- and chemical-etch resistant dielectric, such as zirconium oxide (ZrO), over the self-aligned implants to fixedly define gate length. The self-aligned gate process includes stair-stepping three successive implants, in respect to both depth and concentration, to provide a dopant concentration gradient inclined depthwise away from each side of the gate. The self-aligned, recessed gate GaAsFET exhibits improved source-gate resistance without degradation of gate-drain capacitance, increased gain and drain-source current, and reduced knee-voltage. Gate length is minimized to the limits of photolithography without degrading input resistance.

20 Claims, 8 Drawing Figures

SELF-ALIGNED RECESSED GATE PROCESS

TECHNICAL FIELD

The present invention relates to a process for making self-aligned gates in integrated circuits, and more particularly to a process for producing self-aligned N+ implanted regions in a Schottky barrier gate in a gallium arsenide (GaAs) enhancement-mode MESFET.

BACKGROUND OF THE INVENTION

In the manufacture of integrated circuits on silicon, self-alignment between the gate and the source and drain regions has previously been used to improve FET device performance over prior structures in which the gate overlapped the source and drain regions. Conventionally, as shown in Millman, *Microelectronics*, pp. 250-252 (1979), self-alignment is obtained in MOSFET fabrication by first applying the gate metallization, masking to define implant regions on each side of the gate, and then ion implanting into silicon through openings in the mask on each side of the gate. The implanted ions cannot penetrate the gate metal and therefore the ions enter the substrate only through the mask openings on either side of the gate. Ion implantation is essentially a line-of-sight process and so the edges of the implant regions are closely aligned with the edges of the gate metallization.

Recently, substantial attention has been devoted to the fabrication of FET circuits in gallium arsenide. In constructing a field effect device in a semiconductor material such as silicon, i.e., to make a MOSFET, the metal gate electrode is separated by an oxide layer from the semiconductor channel. In making field effect devices in a semi-insulating material, such as GaAs, the gate metal is placed in direct contact with the semiconductor. An example of one process for making GaAsFET digital integrated circuits is described in "A High-Yield GaAs MSI Digital IC Process" by A. Rode, A. McCamant, G. McCormack and B. Vetanen, published in the minutes of the International Electron Devices Meeting, December 1982. This article describes a depletion-mode non-self-aligned gate GaAsFET process.

In the case of a depletion-mode device, with the gate unbiased, the active region below the gate is conductive. However, for many applications, it is preferable for such region to be nonconductive when the gate is unbiased, which requires an enhancement-mode (E-mode) structure. In GaAsFET devices, enhancement-mode requires that the channel be lightly doped or thin enough that the inherent gate depletion layer pinches off the channel at zero gate bias.

It is also necessary, however, to maintain conductivity on either side of the channel, between the source and gate and between the gate and drain. In a device shown in FIG. 1 of the Rode, et al. article, the gate is spaced apart from both the source and drain regions. Sufficient conductivity is inherently provided on either side of the gate in depletion-mode devices. Reducing active region thickness, or doping concentration, to make an enhancement mode device, undesirably reduces conductivity alongside the gate, which undesirably increases resistance, particularly source resistance $R_s$ which also reduces device gain.

Two different enhancement-mode GaAsFET design approaches have been developed, which endeavor in different ways to maintain adequate active region conductivity alongside the gate, while obtaining enhancement-mode characteristics beneath the gate. One approach is to use a thin active layer, disposed close to the substrate surface beneath a planar gate, together with self-aligned implants on either side of the channel. The other approach is to use a deep active layer, together with a gate which is recessed into the substrate to provide a thin channel beneath the gate but thicker conductive regions on either side of the gate. Examples of these two design approaches are next described.

An early self-aligned GaAsFET gate process is described in an article entitled "EB-Writing N+ Self-Aligned GaAs MESFETs for High-Speed LSIs," International Electron Devices Meeting, December 1982, by K. Yamasaki, N. Kato, Y. Matsuoka, and K. Ohwada and in "Self-Align Implantation for N+-Layer Technology (SAINT) for High-Speed GaAs Ics," Electron. Lett. V. 18, pp. 119-121, February 1982, by K. Yamasaki, K. Asai, T. Mizutani, and K. Kurumada. The described SAINT process is intended to produce very high-speed GaAsFETs by reducing gate length. In this process, a multi-layer self-aligned implant mask is applied to a semi-insulating GaAs substrate, upon which a silicon nitride passivation film has been deposited. The bottom mask layer is selectively etched to undercut the mask. After N+ implantation, a layer of $SiO_2$ is applied, the mask is removed, the silicon nitride film is plasma etched to expose the substrate, and the gate metal is applied. The foregoing procedure produces a planar self-aligned gate contact which has a length in contact with the substrate that is defined by the edges of the $SiO_2$ layer and is spaced inward of the N+ implants. Unfortunately, use of a planar gate forfeits the ability to manipulate the physical thickness of the active layer. Only dopant concentration and doping depth of the active layer remain for manipulation to regulate enhancement-mode device characteristics.

Alternatively to the planar self-aligned gate configuration described above, it has been proposed to form a recess in the substrate to receive the gate metallization. For example, a recessed gate has been incorporated into the non-aligned GaAsFET structure disclosed in the foregoing article by Rode, et al. This approach has certain advantages over a planar gate contact, particularly in controlling the effective thickness of the active layer of the device. The depth of the recess can be manipulated, in addition to doping concentration and overall depth of the active region, to control enhancement-mode characteristics of the device. Use of a recessed gate also allows the active region to be made relatively thick alongside the gate to maintain conductivity and to minimize surface depletion effects which can reduce device gain.

Difficulties arise, however, in accurately positioning the recess, which must be formed prior to applying the gate. In particular, it is difficult to position the recess and gate consistently relative to the source and drain regions. Consequently, use of a recessed gate has not found wide acceptance. The 1984 Technical Digest of the IEEE GaAs IC Symposium reports the current state of the gallium arsenide integrated circuit art. In the area of circuit fabrication, articles entitled "A Self-Aligned Gate Modulation-Doped (Al,Ga)As/GaAs FET IC Process," by N. C. Cirillo, Jr., J. K. Abrokwah, and S. A. Jamison (pp. 167-170) and "A Low Power Gigabit IC Fabrication Technology," M. J. Helix, S. A. Hanka, P. J. Vold, and S. A. Jamison (pp. 163-166) both reject the use of recessed gate designs in favor of planar gate designs in making self-aligned gate enhancement-mode GaAs MESFETs and MODFETs.

Another problem arises in annealing self-aligned GaAsFETs after gate deposition. Furnace annealing is conventionally carried out over, e.g., 20 minutes, at about 800° C. At such high temperatures a difference in coefficients of thermal expansion produces stresses at the interface between the metal gate and gallium arsenide, causing inferior Schottky barrier properties. Migration of impurities from the gate metallization into the channel region during annealing also degrades device performance, as does lateral diffusion of the implanted silicon ions. These problems contribute to very low yields of operative GaAs devices. In the process described in the above-mentioned paper by Cirillo, et al., the researchers try to minimize these problems by using a rapid thermal anneal to activate the self-aligned gate implants instead of conventional furnace annealing. This manner of annealing appears from the report of Cirillo, et al. to offer satisfactory results but does not totally avoid heating, for a short time, of the Schottky interface. Metal can diffuse very rapidly at annealing temperatures. It remains to be seen whether rapid annealing such self-aligned devices will prove acceptable in production process. In view of the current lack of understanding of the physics of the Schottky interface, it would be preferable not to risk degradation of the gate by metal diffusion. The SAINT process, reported above by K. Yamasaki, et al., avoids such risk and seeks to controllably separate the N+ self-aligned implants from the planar gate contact by a distance equal to the expected lateral diffusion of the N+ implants. Known recessed gate designs likewise apply gate metalization after annealing.

Another limitation of prior self-aligned gate processes is that the implants on each side of the gate are essentially identical in dopant concentration. On one hand, it is preferable to have a high doping concentration between the source and gate to minimize source resistance $R_s$. On the other hand, it is preferable to have a low doping concentration in the drain side implant to minimize gate/drain capacitance $C_{GD}$. In conventional self-aligned gate processes, however, it is impractical to provide asymmetrical implant doping concentrations. In the SAINT devices described above, spacing the gate contact inward of the self-aligned N+ implants improves drain capacitance but degrades source resistance. In recessed gate devices, the difficulty of consistently positioning the recessed gate relative to the gate and drain implants makes these parameters highly variable, contributing to low device yield. It would be preferable for gate position to be noncritical.

Finally, it is well recognized as desirable to minimize gate dimensions, but the ability to minimize gate length is limited by difficulties in photolithographically reproducing small (e.g., submicron) features in photoresist. Also, the use of a very small dimension gate metallization produces a high gate metal resistance, $R_{in}$. Smaller gate lengths also make it more difficult reliably to transfer small features from the photoresist into the wafer. For example, in the aforementioned SAINT process, it is difficult to control actual gate dimensions. The edges of the SiO$_2$ layer are wedge-shaped because they are not deposited in a direct line of sight from the sputtering source. For the same reason, the structural integrity of the edges is poor. The edge of the SiO$_2$ also is etched back by plasma. Consequently, the resulting gate is longer than the undercut mask and edge definition is poor.

Accordingly, a need remains for an improved self-aligned gate structure and process for fabricating self-aligned gates and to facilitate further reductions in gate length.

SUMMARY OF THE INVENTION

One object of the invention is, therefore, to improve upon prior self-aligned gate processes.

Another object is to provide an improved enhancement-mode GaAsFET gate structure.

A further object is to minimize gate length down to the limits of photolithography.

An additional object is to facilitate a reduction in source resistance $R_s$ without degrading gate-drain capacitance $C_{GD}$.

Still another object is to facilitate accurate, reliable transfer of small gate features from photoresist into device structure while maintaining a low gate metal resistance $R_{in}$.

Yet another object of invention, as aforementioned, is to avoid furnace annealing a wafer after gate metallization.

One feature of the invention is an integrated circuit gate process and structure which provides a self-aligned, recessed gate GaAsFET. We have discovered that self-alignment and recessed gate features can be advantageously combined to provide improved device performance without many of the disadvantages of prior non-self-aligned, recessed gates and in prior self-aligned, planar gates.

A second feature of the invention is an improvement over prior self-aligned gate processes which includes making the self-aligned implants prior to gate metallization, with an intermediate step of applying a layer of plasma-etch resistant dielectric, such as zirconium oxide (ZrO) over the implants to fixedly define gate length.

A third feature of the invention is a self-aligned gate process which includes stair-stepping three successive implants, in respect to both depth and concentration, to provide a dopant concentration gradient inclined depthwise away from each side of the gate. This implant arrangement improves source resistance without increasing gate-drain capacitance, and is particularly advantageous in implementing a self-aligned recessed gate structure.

Additional objects, features and advantages of the invention will become more readily apparent from the following detailed description of a preferred embodiment thereof, which proceeds with reference to the accompanying drawings.

DETAILED DESCRIPTION OF PREFERRED EMBODIMENT

Figure 4:
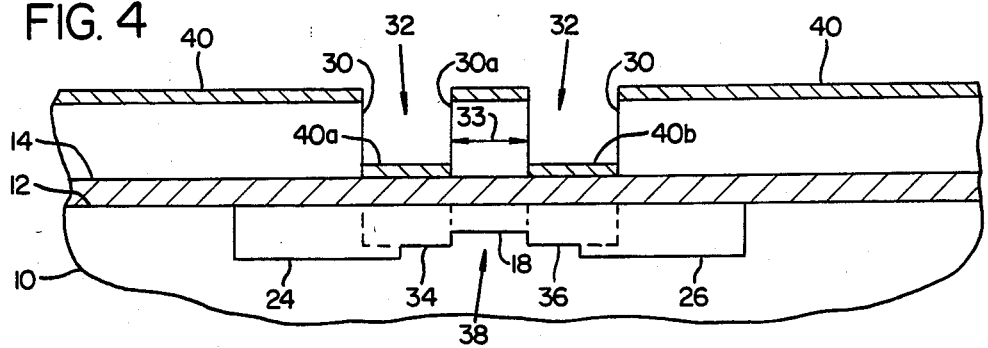
FIG. 4 shows the substrate portion as processed through FIG. 3, following deposition of a zirconium oxide layer to cover the gate-defining implant regions.
Figure 5:
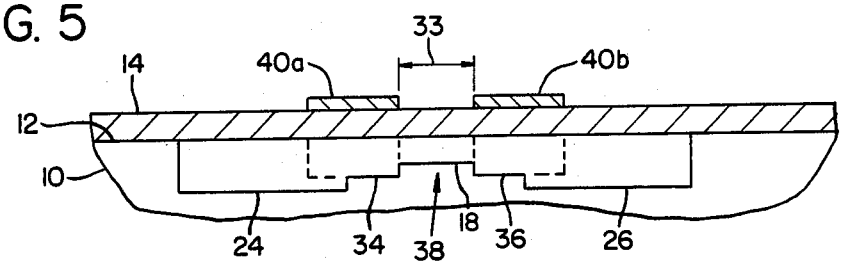
FIG. 5 shows the substrate portion of FIG. 4 following the removal of the third photoresist mask and zirconium oxide deposited thereon.
Figure 6:
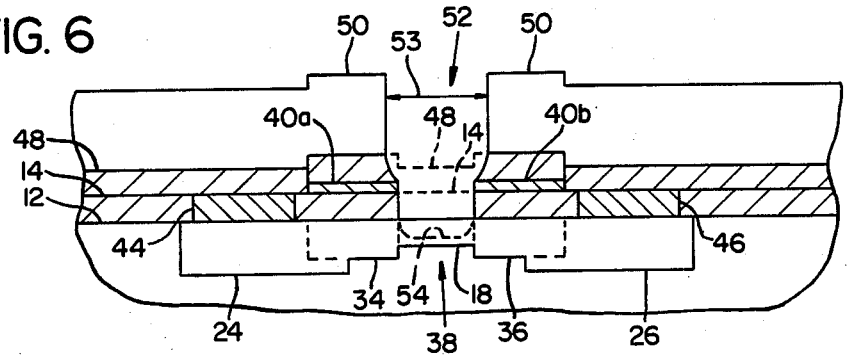
FIG. 6 shows the substrate portion of FIG. 5 following a fourth photolithography step and deposition of ohmic source and drain contacts, deposition of a third dielectric layer, and a fifth photolithography step.

A semi-insulating GaAs wafer is used as the substrate 10 in carrying out the process of FIGS. 1–7. The wafer is cut so that the deposition surface 12 is in the (100) crystallographic plane and the gate is aligned so that, when etched as illustrated in FIG. 6, a recessed channel is formed with inwardly-sloping sides, as described hereinafter.

Figure 1:
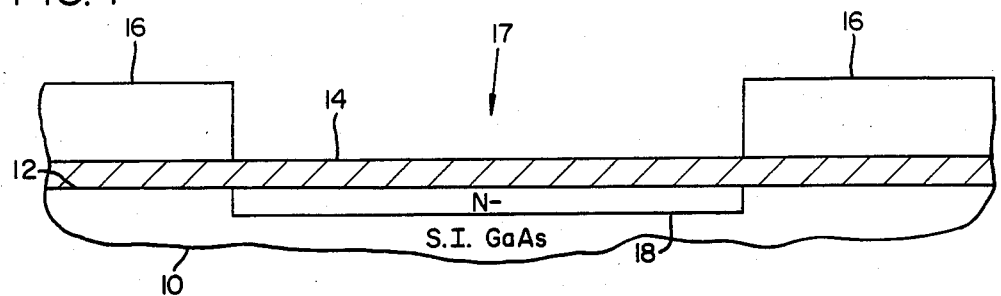
FIG. 1 is a cross-sectional view of a portion of a GaAs substrate following deposition of a first dielectric layer, a first photolithography step, and implantation of an N− doped region generally defining the gate region.

Referring to FIG. 1, following customary wafer cleaning procedures and inspection, a first dielectric layer 14 of silicon nitride ($Si_3N_4$), having a thickness of 1,000–5,000 Å, is deposited over the entire surface of the substrate 12. This deposition step is followed by a first photolithography masking step to define a channel region 17. The channel region is oriented to align the gate parallel to the $<0\bar{1}1>$ direction on the seed face of the substrate. Silicon ions are then implanted through opening 17 in the photoresist 16 and through layer 14 into the GaAs substrate to produce an N− (e.g., $3 \times 10^{17}$ average dopant concentration) implant 18 in the channel region. The ion implant energies are controlled to produce an active layer having a total effective thickness greater than is used in planar self-aligned enhancement-mode GaAsFETs, e.g., on the order of 2,000–3,000 Å, anticipating recessing the gate in FIGS. 6 and 7 to a depth of, e.g., 800–1,000 Å. The foregoing dimensions may be adjusted as needed for a particular application. Upon completion of the N− implant, photoresist layer 16 is removed.

Figure 2:
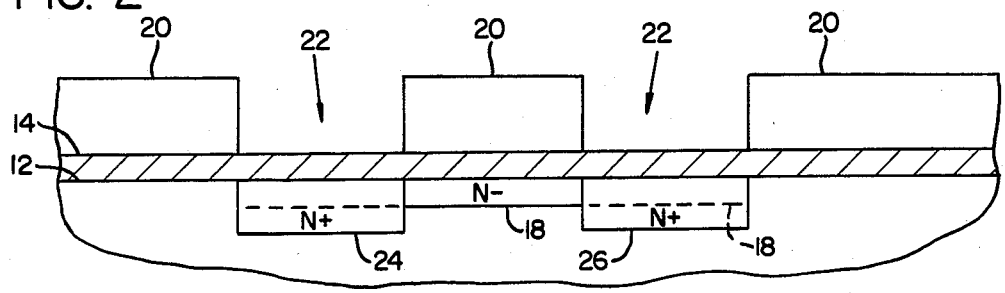
FIG. 2 shows the substrate portion of FIG. 1 following a second photolithography step and an N+ implant step to define the source and drain regions of the device.

Proceeding to FIG. 2, a second photolithography step is performed to provide a photoresist mask 20 defining a pair of openings 22 spaced apart about the center of the N− implant 18 and approximately aligned with the periphery of the N− implant. A second implant step is performed to implant silicon ions to a depth approximately twice the depth of the N− implant 18 and to an N+ (e.g., $2 \times 10^{18}$) average dopant concentration to form source and drain implant regions 24, 26. Photoresist mask 20 is then removed.

Figure 3:
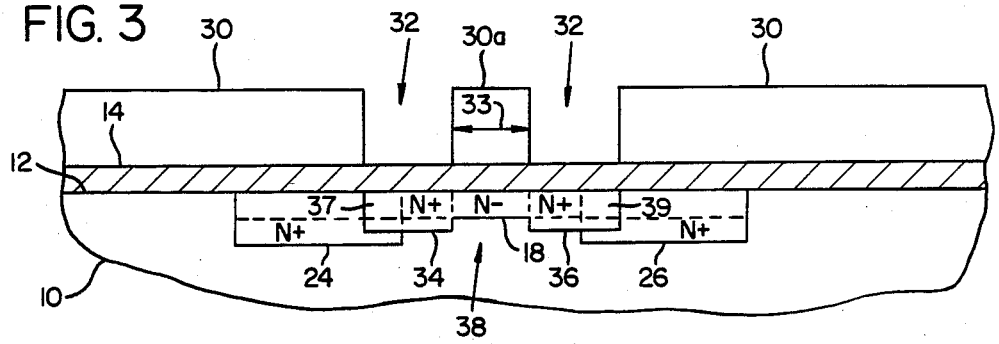
FIG. 3 shows the substrate portion of FIG. 2 following a third photolithography step, followed by a third, self-aligned gate-defining N+ implant into closely-spaced regions overlapping the N+ implants of FIG. 2.

In FIG. 3, a third photolithography step is performed. This step provides a photoresist layer 30 defining a pair of openings 32 which, like openings 22 in FIG. 2, are centered in channel region 18, but are smaller and spaced closely together so as to overlap the inner periphery of the first N+ implants 24, 26. Preferably, the spacing of openings 32 is as close as practicable. In present photolithographic techniques, a photoresist bridge 30a can be reliably made with a width 33 of as little as 1 μm. For this example, it is assumed that width 33 equals 1 μm, with the understanding that the principles of the invention can be applied to smaller dimensions as photolithographic techniques continue to improve.

A third implant step is next performed, to implant silicon ions through openings 32 to form self-aligned source-side and drain-side implant regions 34, 36. Ions are implanted in regions 34, 36 to a slightly lower concentration than in the N+ implant step of FIG. 2 e.g., $1 \times 10^{18}$ and to a depth intermediate the N− and N+ implants of FIG. 2.

Figure 8:
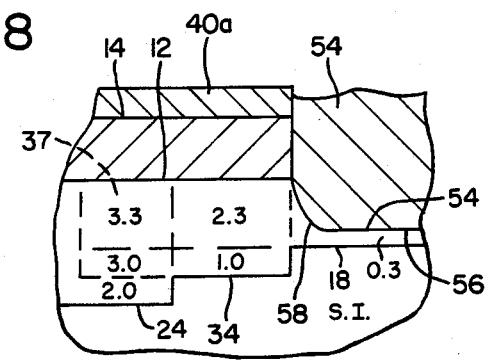
FIG. 8 is a vertically enlarged view of the source-gate region of FIG. 7, the gate-drain region being substantially a mirror image thereof, showing an example of average total doping concentrations in the substrate.

Thus, a stair-stepped doping pattern is provided by the sum of the average implant concentrations. The least dopant concentration occurs in the channel region in gap 38, between self-aligned implants 34, 36, and beneath center mask element 30a. The greatest concentration occurs generally in the self-aligned implant regions 34, 36, but with decreasing gradations proceeding from regions 37, 39 of maximum concentration where implant regions 18, 24, 34 and 18, 36, 26 all overlap, proceeding inward toward gap 38 and downward into the substrate. The total average implant concentrations ($\times 10^{18}$) are shown in FIG. 8, it being understood that each successive implant includes an approximately Gaussian depthwise concentration distribution such that the combined depthwise implant gradient is substantially steeper than the nominal values shown in FIG. 8 indicate.

In FIG. 4, continuing to utilize mask 30, a second dielectric layer, this time a thin (e.g., 200 Å) layer 40 of zirconium oxide (ZrO) is deposited on the surface of the first dielectric layer 14 through openings 32 and, nonessentially, atop the photoresist layer 30. Patches 40a, 40b are thus formed on either side of gap 38, which patches cover implants 34, 36 in precise self-alignment with the edges of such implants.

Referring to FIG. 5, the photoresist layer 30 is removed, which removes the zirconium oxide layer 40 deposited atop the photoresist, but leaves the zirconium oxide patches 40a, 40b deposited atop the silicon nitride first dielectric layer 14. Next, the wafer is furnaced annealed to activate the ion implants.

Referring to FIG. 6, following annealing, a fourth, ohmic-contact photolithography step (not shown) is performed, followed by a plasma etch procedure to define ohmic-contact openings in silicon nitride layer 14 over the source and drain regions of the gate. These steps are followed by deposition of ohmic metal (Au-Ge-Ni) through the openings to form source and drain ohmic contacts 44, 46. Then, the ohmic metal deposition photoresist mask is removed. The ohmic metallization is then alloyed to the GaAs.

This step is followed by the deposition of a second layer 48 of silicon nitride over the entire surface area of the gate region. A sixth, gate photolithography step is performed to provide a mask of photoresist 50 over the entire channel region, having an opening 52 approximately centered over gap 38, but of somewhat wider dimensions than such gap. The silicon nitride layers 14, 48 are then plasma etched through opening 52. The thin zirconium oxide patches 40a, 40b resist the plasma etch and therefore confine the removal of material to a narrow channel aligned with the inward edges of the patches and of implants 34, 36, down to the substrate surface 12.

Next, referring to FIG. 6, with photoresist layer 50 still in place, the wafer is subjected to a liquid chemical etching process to form a gate recess or channel 54 in the substrate. A suitable chemical etchant is provided by a water mixture of dilute ammonium hydroxide and hydrogen peroxide, which selectively etches the gallium arsenide substrate, but not the silicon nitride and zirconium oxide dielectric layers. The current which flows when a nominal bias, e.g., 2.5 volts, is applied across the ohmic contacts (source and drain) is monitored to determine the stopping point in the etching process which will produce the desired pinch-off voltage, and therefore the depth to which channel 54 is etched.

Next, gate metal (Ti-Pd-Au) is deposited through opening 52 in mask 50. The resultant gate metallization 56 extends downward into recess 54 into contact with the N— doped region 18 in gap 38. The length 33 of the gate contact 56 at the surface 12 of the substrate is defined by the spacing of the inward edges of the zirconium oxide patches 40a, 40b, established in the deposition step of FIG. 4, and unaffected by the etching steps. Correspondingly, the edges of the gate contact are precisely aligned at substrate surface 12 with the inward edges of the self-aligned implants, formed in FIG. 3.

The gate contact has a shape defined by the recess below substrate surface 12 which is approximately trapezoidal, that is, the gate contact has opposite sides 58 which are inclined inwardly, away from the inner edges of implants 34, 36 proceeding depthwise into the substrate. This shape, best seen in FIG. 8, spaces gate contact sides 58 inward a distance from the inward edges of the self-aligned implants a distance that is very small but useful to counteract any lateral diffusion of silicon ions from the self-aligned implants into gap 38. The shape of the gate recess was established at the beginning of the process by the choice of crystallographic face and in FIG. 2 by the orientation of the gate direction.

The length of the gate metallization above the zirconium oxide patches 40a, 40b is determined by the dimension of opening 52 in photoresist 50, established in FIG. 6. This dimension can be, and preferably is, greater than the gate contact length 33 so that any mask-to-wafer misalignment is noncritical. Making dimension 53 greater than gate contact length 33 also minimizes input gate resistance $R_{in}$, while providing the narrowest possible gate length in contact with the active implant region 18. Gate contact length 33 can be readily minimized down to the limits of photolithography because this dimension is set initially by photoresist 30 and the self-aligned implant, prior to applying the gate metallization, and is maintained through the etching steps by the ZrO patches. The self-aligned implants can therefore be spaced much closer together than the maximum length of the gate metallization, while the length of the gate metal contact with the gallium arsenide substrate is no greater than the spacing of the self-aligned implant. The foregoing procedure also allows the gate to be fabricated to include a gate recess, without requiring an intermediate masking step prior to gate metal deposition, to uniquely set the device threshold or pinch-off voltage.

Referring back to FIG. 7, after deposition of the gate metal, the gate metal photoresist layer 50 is removed. A third layer 60 of silicon nitride is deposited to a thickness of about 1,000 Å. A sixth photolithography step is performed, the silicon nitride is plasma etched through openings in the photoresist, and a first layer of interconnect metal (Ti-Pd-Au) is deposited through the photoresist and openings in the silicon nitride to form metal interconnections 62, 64 with the ohmic metal contacts 44, 46, respectively. The photoresist is then removed. A fourth layer of silicon nitride (not shown) is then deposited over the circuit of FIG. 7 to a thickness of about 1,000 Å.

Figure 7:
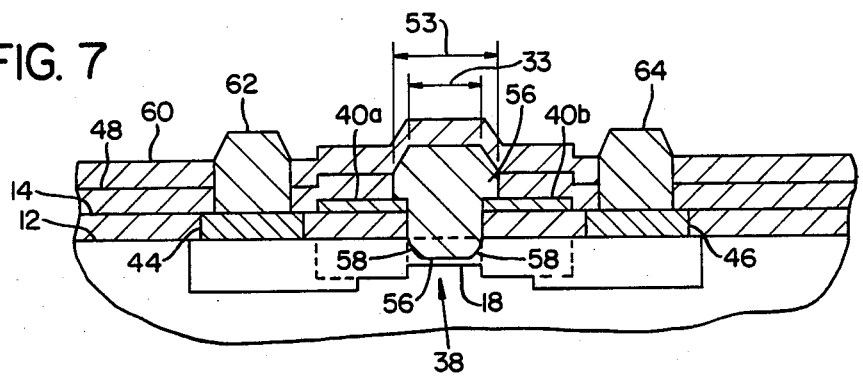
FIG. 7 shows the substrate portion of FIG. 6 following, in turn, plasma and chemical etching steps, gate metallization, deposition of a fourth dielectric layer, a sixth photolithography step and metallization of the source and drain contacts.

Further conventional steps, not shown in FIG. 7 and not essential to the present invention, complete the circuit by providing an air bridge interconnect to the source contact 62 from another part of the circuit (not shown). This procedure includes an air bridge photolithography step followed by plasma etching the silicon nitride through an opening in the photoresist to expose source contact 62. Air bridge metallization (Ti-Au-Ti) is then deposited. A second air bridge photolithography step is performed to define the air bridge circuitry pattern. The air bridge metallization is gold plated and then the air bridge is etched in accordance with the gold plate defined pattern.

Self-aligned, recessed gate, enhancement-mode GaAsFETs have been successfully constructed in accordance with the foregoing description and tested in comparison with conventional non-aligned, recessed gate enhancement-mode GaAsFETs. Both types of the devices tested had a gate length of 1.0 μm and width of 300 μm. These measurements were taken at a bias of $V_{ds}=0.4$ V, $V_{gs}=0.4$ V. For comparison purposes, devices with identical pinch-off voltages should ordinarily be measured. In lieu of this, two devices of each type were measured, demonstrating that the dependence of the critical parameters on $V_p$ is smaller than the dependence on self vs. non-self-alignment.

| Comparison of DC and RF Parameters | | | | | |
|---|---|---|---|---|---|
| | | Self-Aligned | | Standard | |
| Parameter | (units) | #1 | #2 | #1 | #2 |
| $V_p$ | (volts) | .095 | .13 | .09 | .11 |
| Ids | (mA) | 6.5 | 5.4 | 3.0 | 3.3 |
| gm | (mS) | 37.8 | 35.0 | 16.95 | 21.53 |
| Ft | (GHz) | 8.95 | 8.69 | 4.39 | 5.3 |
| Vd | (ohms) | 156 | 191 | 137 | 140 |
| gmrd | (gain) | 5.9 | 6.7 | 2.3 | 3.0 |
| Cgd | (pf) | 224 | 212 | 213 | 215 |
| $R_s$ | (ohms) | 4.0 | 4.5 | 10.8 | 10.0 |

This data show that improved Ids, gm, Ft and $R_s$ obtained from the self-aligned process. It also shows a minimal penalty in Cgd due to the spacing of the N+ drain implant slightly away from the drain side of the gate. Comparative I–V curve traces for the two types of devices also demonstrated that the devices of the invention provide lower knee voltage.

Having illustrated and described the principles of our invention in a preferred embodiment thereof, it should be readily apparent to those skilled in the art that the invention can be modified in arrangement and detail without departing from such principles. For example, the various mask openings that have been described need not be formed by photolithography, since it is only the actual presence of the opening that has any bearing on the invention. We claim all modifications coming within the spirit and scope of the accompanying claims.

We claim:

1. A self-aligned gate process for fabricating an integrated circuit device comprising:
    providing a substrate having a reference surface, the substrate being composed of a material etchable by a first etchant;

implanting ions to form an active device region within the substrate extending to a first predetermined depth below said surface;

masking the reference surface over the active device region with an ion-opaque, removable first mask layer;

forming a pair of spaced-apart openings in the mask within the active device region;

implanting ions through the pair of openings into the active device region to form a pair of self-aligned implant regions spaced apart about a gap having a first length defined by the spacing of the openings;

depositing a dielectric layer through the mask openings onto the substrate so as to cover the self-aligned implant regions, the dielectric layer being composed of a first dielectric material resistant to said first etchant;

removing the first mask layer and any of the said dielectric material deposited thereon while leaving two spaced-apart patches of the dielectric material covering the self-aligned implant regions and aligned therewith;

masking the reference surface and the two patches of dielectric material with a second mask layer;

forming an opening in the second mask layer in a location and of a second length encompassing at least a portion of said gap and overlapping an adjoining portion of at least one of the two patches;

etching the substrate material through the opening in the second mask to form a recess in said active region having a second predetermined depth less than said first depth and a length at said reference surface that is defined by the gap between the two patches of dielectric material; and depositing a gate conductor material through the opening in the second mask to form a gate having a gate contact in contact with the substrate material within the gap, the gate contact having a maximum length defined by said recess.

2. A gate process according to claim 1 in which the substrate material includes GaAs and the first dielectric material includes ZrO.

3. A gate process according to claim 1, including:
prior to the first masking step, depositing on the substrate reference surface a preliminary dielectric layer composed of a second dielectric material etchable by a second etchant, the first dielectric material being resistant thereto; and
prior to etching the substrate material, etching the preliminary dielectric layer through the opening in the second mask to expose the substrate material.

4. A gate process according to claim 3 in which the first material is GaAs; the second material is $Si_3N_4$; and the third material includes ZrO.

5. A gate process according to claim 1 including sizing the opening in the second mask layer so that the second length is greater than the first length.

6. A gate process according to claim 1 including annealing the substrate prior to the step of depositing gate material.

7. A gate process according to claim 1 including selecting for said dielectric layer and for said substrate, materials having approximately equal coefficients of thermal expansion.

8. A gate process according to claim 1 including:
selecting for said substrate material a crystalline material having a crystallographic structure which said first etchant etches anisotropically;
selecting as said reference surface a face of the material such that the material etches at a non-normal inclination to the reference surface; and
orienting the gate on the reference surface so that the recess is formed with opposite sides inclined inward proceeding depthwise into the substrate so as to space the gate conductor material away from the gate implant regions at said predetermined depth.

9. A gallium arsenide (GaAs) integrated circuit gate structure, comprising:
a GaAs substrate having a reference surface;
a first region within the substrate doped to a first dopant concentration and a first depth;
a second region, adjoining the first region within the substrate, doped to a second dopant concentration greater than the first concentration and defining a dopant gradient boundary extending depthwise into the substrate from the reference surface;
a dielectric layer covering a portion of the substrate surface including the second doped region and having an edge aligned with said dopant gradient boundary;
means defining a channel aligned with said edge and recessed depthwise into the substrate in the first doped region to a second depth less than the first depth; and
conductive gate material filling the channel;
the channel having a sidewall aligned at the reference surface with the edge of the dielectric layer and with the dopant gradient boundary.

10. A GaAs gate structure according to claim 9 in which the sidewall of the channel is inclined inwardly proceeding downward so as to space the conductive gate material away from the gradient boundary.

11. A gate structure according to claim 9 including a third region within the substrate, doped to a third concentration greater than the first and second concentrations and spaced apart from the dopant gradient boundary and the first region.

12. A self-aligned gate process for making integrated circuits, comprising
providing a semi-insulating substrate having a reference surface;
doping a first defined area of the substrate to a first dopant concentration and a first depth;
doping a pair of second defined areas of the substrate overlapping the first defined area and spaced apart therein at a first spacing, to a second concentration and a second depth that are greater than the concentration and depth of doping in the first area;
doping a pair of third defined areas of the substrate, overlapping the second areas within the first area and spaced apart therein to define inward boundaries at a second spacing less than the first spacing, to a third concentration intermediate the first and second concentration and a depth intermediate the first and second depth;
depositing a dielectric layer atop the substrate, solely over the third areas so as to define two dielectric patches having a gap between them which is aligned with said inward boundaries;
masking the substrate with a mask layer and forming an opening in the mask layer encompassing at least a portion of said gap; and
depositing a conductive gate material through the opening to form a gate contact within the gap.

13. A method according to claim 12 including:
composing the dielectric patches of zirconium oxide;

depositing a plasma-etchable dielectric layer over said surface prior to doping said first defined area; and plasma etching the plasma-etchable dielectric through the opening in the mask layer;

the zirconium oxide patches confining the plasma etch to the gap within said inward boundaries.

14. A method according to claim 12 including selectively etching a recess in the substrate within the gap, the dielectric patches being composed of an etch-resistant dielectric material.

15. A method according to claim 12 including:

depositing a first dielectric layer over said surface prior to doping said first defined area;

depositing a third dielectric layer over said substrate including over said first, second and third areas, the first and third dielectric layers each being formed of a dielectric material removable by a predetermined etchant and the dielectric patches being formed of a different dielectric material resistant to said etchant;

etching through the opening with said predetermined etchant to remove portions of the first and third dielectric layers exposed within said gap and thereby expose a portion of the reference surface of the substrate within the gap; and etching the exposed portion of the substrate surface so as to form a recess, the substrate in the gap having a predetermined depth from the reference surface.

16. A self-aligned gate process for making integrated circuits, comprising:

providing a semi-insulating substrate having a reference surface;

depositing a first dielectric layer over said surface;

applying a layer of photoresist over the first dielectric layer and forming a pair of closely spaced apart openings extending through the photoresist to expose a surface portion of the first dielectric layer through said openings;

implanting ions through the photoresist openings into the substrate to define two implanted regions having implant boundaries substantially aligned with said openings and spaced apart to define a gap between the regions;

depositing a second dielectric layer on the photoresist and within the openings atop the surface portion of the first dielectric layer exposed therein;

removing the layer of photoresist, thereby removing the second dielectric layer deposited thereon and leaving a pair of areas of the second dielectric layer atop the first dielectric layer extending over the pair of implanted regions and having dielectric boundaries spaced closely apart in alignment with said implant boundaries to define a gap in accordance with the spacing of the openings; and etching within said gap with a first predetermined etchant selectively to remove the first dielectric layer and thereby expose a portion of the substrate bounded by the boundaries of said second dielectric layer; and depositing a conductive gate material within the gap and the recess to form a gate contact;

the second dielectric layer being composed of a material which is non-etchable by the first etchant so that the gate contact is aligned with the implant boundaries in accordance with the closely-spaced-apart openings in the photoresist.

17. A method according to claim 16 including:

implanting ions into a region of the substrate including said gap, prior to applying the layer of photoresist, to a first depth below the reference surface; and etching the exposed portion of the substrate surface with a second predetermined etchant so as to form a recess in the substrate within the gap having a depth less than the first depth for producing a predetermined pinch-off voltage;

the second dielectric layer material being resistant to the second etchant.

18. A method according to claim 17 including selecting a substrate having a crystallographic structure in the reference surface which the second etchant etches anisotropically and orienting the gate on the reference surface so that the recess is etched to form nonparallel opposite sides which are inclined toward one another and away from the second defined doped areas proceeding depthwise into the substrate.

19. A method according to claim 16 including selecting as said second dielectric layer material a material having a thermal coefficient of expansion approximately equal to a coefficient of expansion of the substrate and following removal of the layer of photoresist and, prior to deposition of conductive gate material, annealing the substrate to heal defects resulting from implanting and to activate the implanted ions.

20. A method according to claim 16 wherein the substrate is gallium arsenide, the first dielectric is $Si_3N_4$ and the second dielectric is $ZrO$.

* * * * *